United States Patent
Bae et al.

(10) Patent No.: US 8,394,571 B2
(45) Date of Patent: *Mar. 12, 2013

(54) METHODS OF FORMING ELECTRONIC DEVICES

(75) Inventors: Young Cheol Bae, Weston, MA (US);
Thomas Cardolaccia, Newton, MA (US); Yi Liu, Wayland, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 282 days.

This patent is subject to a terminal disclaimer.

(21) Appl. No.: 12/825,166

(22) Filed: Jun. 28, 2010

(65) Prior Publication Data

US 2011/0117490 A1    May 19, 2011

Related U.S. Application Data

(60) Provisional application No. 61/281,681, filed on Nov. 19, 2009, provisional application No. 61/335,168, filed on Dec. 31, 2009.

(51) Int. Cl.
*G03F 7/00* (2006.01)
*G03F 7/004* (2006.01)
*G03F 7/40* (2006.01)

(52) U.S. Cl. ............ 430/270.1; 430/271.1; 430/273.1; 430/312; 430/322; 430/330; 430/331

(58) Field of Classification Search .......... 430/270.1, 430/271.1, 273.1, 312, 322, 330, 331
See application file for complete search history.

(56) References Cited

U.S. PATENT DOCUMENTS

| 5,100,696 | A  | * | 3/1992 | Talvalkar et al. | 427/130 |
|---|---|---|---|---|---|
| 8,067,146 | B2 | * | 11/2011 | Jung | 430/311 |
| 8,173,358 | B2 | * | 5/2012 | Kim et al. | 430/312 |
| 2002/0081504 | A1 | * | 6/2002 | Kong et al. | 430/18 |
| 2004/0121615 | A1 | * | 6/2004 | Kaneko et al. | 438/758 |
| 2006/0127816 | A1 | * | 6/2006 | Kang et al. | 430/312 |
| 2008/0199814 | A1 | * | 8/2008 | Brzozowy et al. | 430/312 |
| 2009/0253080 | A1 | * | 10/2009 | Dammel et al. | 430/324 |
| 2010/0090372 | A1 | * | 4/2010 | Ishikawa et al. | 264/342 R |
| 2010/0190104 | A1 | * | 7/2010 | Nakamura et al. | 430/270.1 |
| 2010/0330471 | A1 |   | 12/2010 | Bae et al. | |
| 2010/0330498 | A1 |   | 12/2010 | Bae et al. | |
| 2010/0330499 | A1 |   | 12/2010 | Bae et al. | |
| 2010/0330500 | A1 |   | 12/2010 | Bae et al. | |
| 2010/0330501 | A1 |   | 12/2010 | Bae et al. | |
| 2010/0330503 | A1 |   | 12/2010 | Bae et al. | |
| 2011/0008729 | A1 |   | 1/2011 | Bae et al. | |

FOREIGN PATENT DOCUMENTS

| EP | 1 975 718 | 10/2008 |
|---|---|---|
| WO | WO 2008/070060 | 6/2008 |
| WO | WO 2008/143301 | 11/2008 |
| WO | WO 2009/009095 A1 | 1/2009 |

OTHER PUBLICATIONS

European Search Report of corresponding European Application No. 10 16 7373.

* cited by examiner

*Primary Examiner* — Amanda C. Walke
(74) *Attorney, Agent, or Firm* — Jonathan D. Baskin

(57) ABSTRACT

Methods of forming electronic devices are provided. The methods involve alkaline treatment of photoresist patterns and allow for the formation of high density resist patterns. The methods find particular applicability in semiconductor device manufacture.

17 Claims, 4 Drawing Sheets

METHODS OF FORMING ELECTRONIC DEVICES

Figure 1:
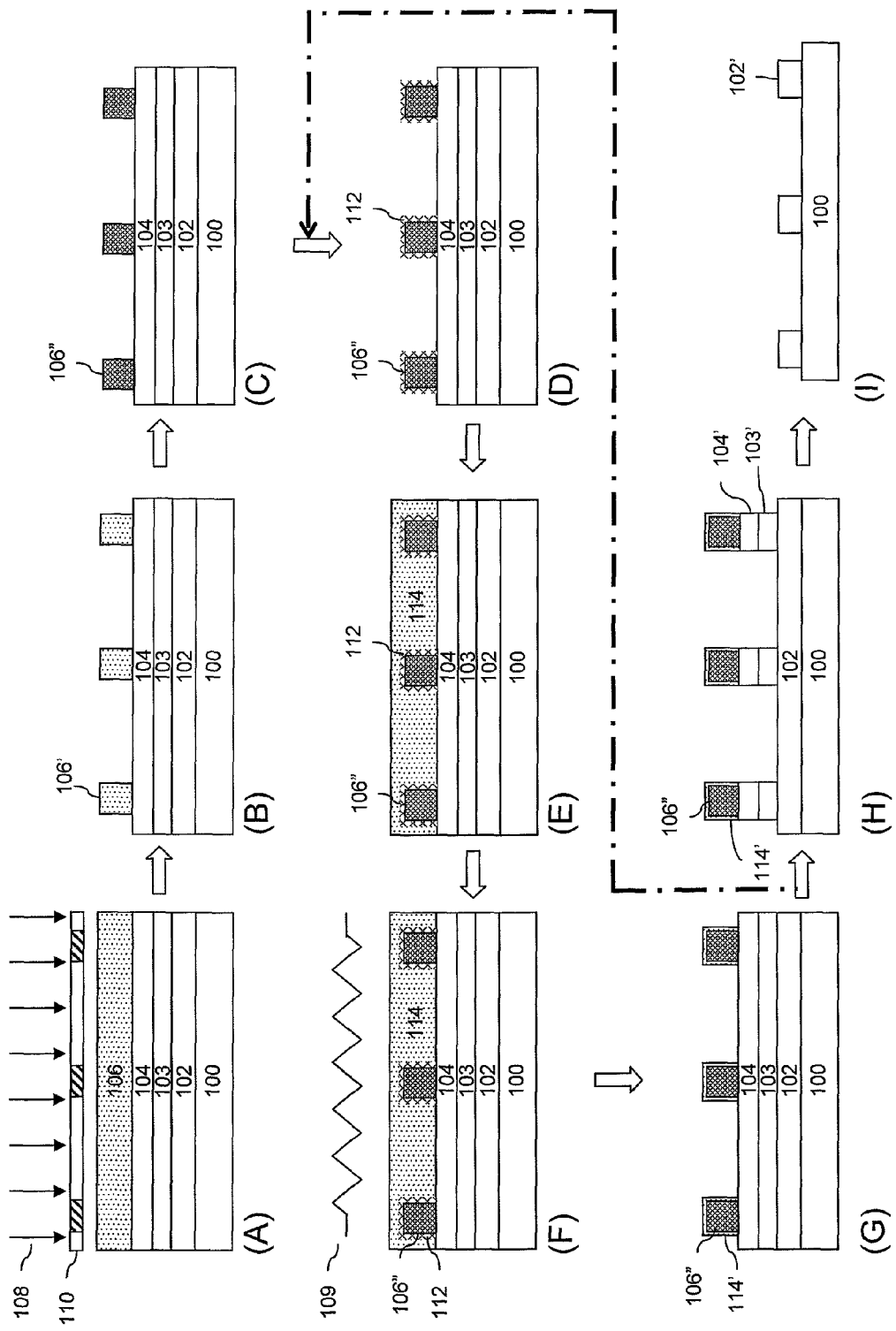

This application claims the benefit of priority under 35 U.S.C. §119(e) to U.S. Provisional Application Nos. 61/281,681, filed Nov. 19, 2009 and 61/335,168, filed Dec. 31, 2009, the entire contents of which applications are incorporated herein by reference.

This invention relates generally to the manufacture of electronic devices. More specifically, this invention relates to photolithographic processes which allow for control of photoresist pattern dimensions. The invention also relates to compositions for treating photoresist patterns which can be used in the methods of the invention.

In the semiconductor manufacturing industry, photoresist materials are used for transferring an image to one or more underlying layers, such as metal, semiconductor or dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

One approach to achieving nm-scale feature sizes in semiconductor devices is the use of short wavelengths of light, for example, 193 nm or less, during exposure of chemically amplified photoresists. Immersion lithography effectively increases the numerical aperture of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium.

The theoretical resolution limit as defined by the Rayleigh equation is shown below:

$$R = k_1 \frac{\lambda}{NA}$$

where $k_1$ is the process factor, $\lambda$ is the wavelength of the imaging tool and NA is the numerical aperture of the imaging lens. When using water as the immersion fluid, the maximum numerical aperture can be increased, for example, from 1.2 to 1.35. For a $k_1$ of 0.25 in the case of printing line and space patterns, 193 nm immersion scanners would only be capable of resolving 36 nm half-pitch line and space patterns. The resolution for printing contact holes or arbitrary 2D patterns is further limited due to the low aerial image contrast with a dark field mask wherein the theoretical limit for $k_1$ is 0.35. The smallest half-pitch of contact holes is thus limited to about 50 nm. The standard immersion lithography process is generally not suitable for manufacture of devices requiring greater resolution.

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer (nm) range, photoresists and photolithography processing tools having high-resolution capabilities have been and continue to be developed.

One approach to achieving nm-scale feature sizes in semiconductor devices is the use of short wavelengths of light, for example, 193 nm or less, during resist exposure. Immersion lithography effectively increases the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium. When using water as the immersion fluid, the maximum numerical aperture can be increased, for example, from 1.2 to 1.35. With such an increase in numerical aperture, it is possible to achieve a 40 nm half-pitch resolution in a single exposure process, thus allowing for improved design shrink. This standard immersion lithography process, however, is generally not suitable for manufacture of devices requiring greater resolution, for example, for the 32 nm and 22 nm half-pitch nodes.

In an effort to achieve greater resolution and to extend capabilities of existing manufacturing tools beyond theoretical resolution limits, various double patterning processes have been proposed, for example, self-aligned double patterning (SADP), litho-etch-litho-etch (LELE) and litho-litho-etch (LLE) techniques. Such techniques as typically implemented, however, suffer from one or more disadvantages. SADP processes typically involve a relatively large number of process steps, thereby adversely affecting production throughput. Product contamination and defectivity can result from LELE techniques from transport of wafers back and forth between photolithography and etching processing modules, and from etching and resist removal processes themselves. LLE procedures involve formation and stabilization of a first lithographic (L1) resist pattern followed by formation of a second lithographic (L2) pattern. Various resist stabilization techniques have been proposed such as ion implantation, UV curing, thermal hardening, thermal curing and chemical curing. U.S. Patent Application Publication No. US 2008/0199814 A1, to Brzozowy et al, discloses an overcoat chemical curing technique in which the resist pattern is coated with a fixer solution comprising a solvent, a fixer compound containing at least two functional groups reactive with an anchor group in a resist polymer, and optional additives such as catalysts, surfactants and polymers. While LLE processes involve fewer process steps than SADP and LELE, it can be difficult to avoid: pattern deformation during resist stabilization; intermixing between L1 and L2 resist layers during the L2 resist coating/soft bake process; and development of L1 patterns during the L2 exposure/develop process.

There is a continuing need in the art for photolithographic processes which address one or more of the problems associated with the state of the art.

In accordance with a first aspect of the invention, methods of forming electronic devices are provided. The methods comprise: (a) providing a semiconductor substrate comprising one or more layers to be patterned; (b) applying a first layer of a photosensitive composition over the one or more layers to be patterned, wherein the first photosensitive composition comprises a first resin component and a photoactive component; (c) exposing the first layer to activating radiation through a patterned photomask; (d) developing the exposed first layer to form a resist pattern; (e) heat treating the resist pattern in a hardbake process; (f) treating the hardbaked resist pattern with a material effective to make alkaline a surface of the resist pattern; (g) applying a second layer of a thermally sensitive composition in contact with the alkaline surface of the resist pattern, the second composition comprising a second resin component and a thermal acid generator; (h) heating the second layer of the thermally sensitive composition to a temperature effective for the thermal acid generator to generate an acid; and (i) developing the heated second layer. Use of such a thermally sensitive layer with activation by heating as opposed to a photoactive layer with the requisite exposure process can provide significant savings both in terms of tool cost and throughput.

In accordance with a further aspect of the invention, a coated semiconductor substrate is provided. The coated semiconductor substrate comprises a semiconductor substrate comprising one or more layers to be patterned; a resist pattern over the one or more layers to be patterned, the resist pattern having an alkaline surface; and a layer of a thermally sensitive composition in contact with the alkaline surface of the resist pattern, the second composition comprising a second resin component and a thermal acid generator.

The present invention will be discussed with reference to the following drawings, in which like reference numerals denote like features, and in which:

FIG. 1A-I illustrates a process flow for forming an electronic device in accordance with the invention;

FIG. 2A-I illustrates a first process flow for a self-aligned spacer double patterning method in accordance with the invention;

FIG. 3A-H illustrates a process flow for a contact hole shrink process in accordance with the invention; and FIG. 4A-H illustrates a process flow for a trench formation process in accordance with the invention.

The invention allows for precise control of critical dimensions in formed lithographic patterns. More particularly, the invention allows for the controlled increase, decrease or maintenance of dimensions of formed resist patterns. The invention can further provide improved line edge roughness (LER) in resist patterns. The invention allows for improved photolithographic patterning techniques, for example, self-aligned spacer multiple patterning as well as shrink processes useful in contact hole and trench formation.

Exemplary aspects of the invention will be described with reference to FIG. 1A-I, which illustrates an exemplary photolithographic process flow for forming an electronic device in accordance with the invention. FIG. 1A depicts a substrate 100 which may include various layers and features formed on a surface thereof. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example: chemical vapor deposition (CVD) such as plasma-enhanced CVD, low-pressure CVD or epitaxial growth; physical vapor deposition (PVD) such as sputtering or evaporation; or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 103 and/or a bottom antireflective coating (BARC) 104 over which a photoresist layer is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer 103 can include a single layer or a plurality of layers of different materials. The hard mask layer can be formed, for example, by chemical or physical vapor deposition techniques.

A bottom antireflective coating 104 may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm), ArF excimer laser light (193 nm), electron beams and soft x-rays. The antireflective coating 104 can comprise a single layer or a plurality of different layers. Suitable antireflective materials and methods of formation are known in the art. Antireflective materials are commercially available, for example, those sold under the AR trademark by Rohm and Haas Electronic Materials LLC (Marlborough, Mass. USA), such as AR™40A and AR™124 antireflectants.

A photosensitive composition is applied on the substrate over the antireflective layer 104 (if present) to form a first photosensitive layer 106. As used herein, the terms "photosensitive material(s)", "photosensitive composition(s)" and "photoresist(s)" are used interchangeably. Suitable photoresist materials are known in the art and include, for example, those based on acrylate, novolak and silicon chemistries. Suitable resists are described, for example, in U.S. Application Publication Nos. US20090117489 A1, US20080193872 A1, US20060246373 A1, US20090117489 A1, US20090123869 A1 and U.S. Pat. No. 7,332,616. The photoresist materials useful in the methods of the invention include both positive- and negative-acting materials. Suitable positive-acting materials include positive-acting chemically amplified photoresists which undergo a photoacid-promoted deprotection reaction of acid labile groups of one or more components of the composition to render exposed regions of a coating layer of the resist more soluble in an aqueous developer than unexposed regions. Typical photoacid-labile groups of the photoresist resins include ester groups that contain a tertiary non-cyclic alkyl carbon (e.g., t-butyl) or a tertiary alicyclic carbon (e.g., methyladamantyl) covalently linked to the carboxyl oxygen of the ester. Acetal photoacid-labile groups also are typical.

The photosensitive composition comprises a resin component and a photoactive component. The resin preferably has functional groups that impart alkaline aqueous developability to the resist composition. For example, typical are resin binders that comprise polar functional groups such as hydroxyl or carboxylate. The resin component is used in the composition in an amount sufficient to render an exposed layer of the composition developable in a developer solution, such as an aqueous alkaline solution. The resin component will typically comprise about 70 to about 97 wt % of total solids of the resist.

The photosensitive composition further comprises a photoactive component employed in an amount sufficient to generate a latent image in a coating layer of the composition upon exposure to activating radiation. For example, the photoactive component will suitably be present in an amount of from about 1 to 20 wt % of total solids of the resist. Typical photoactive components in the resist compositions are photoacid generators. Suitable PAGs are known in the art of chemically amplified photoresists and include, for example: onium salts, for example, triphenyl sulfonium salts, nitrobenzyl derivatives, sulfonic acid esters, diazomethane derivatives, glyoxime derivatives, sulfonic acid ester derivatives of an N-hydroxyimide compound and halogen-containing triazine compounds. One or more of such PAGs can be used.

A typical optional additive of the resists is an added base, particularly tetrabutylammonium hydroxide (TBAH), or tetrabutylammonium lactate, which can enhance resolution of a developed resist relief image. For resists imaged at 193 nm, a typical added base is a hindered amine such as diazabicyclo undecene or diazabicyclononene. The added base is suitably used in relatively small amounts, for example, about 0.03 to 5 wt % relative to the total solids.

Photoresists used in accordance with the invention also may contain other optional materials. For example, other optional additives include anti-striation agents, plasticizers and speed enhancers. Such optional additives typically will be present in minor concentrations in a photoresist composition except for fillers and dyes which may be present in relatively large concentrations, for example, in amounts of from about 0.1 to 10 wt % based on the total weight of a resist's dry components.

Suitable negative-acting resists typically will contain a crosslinking component. The crosslinking component is typically present as a separate resist component. Amine-based crosslinkers such as a melamine, for example, the Cymel melamine resins, are typical. Negative-acting photoresist compositions useful in the invention comprise a mixture of materials that will cure, crosslink or harden upon exposure to acid, and a photoactive component of the invention. Particularly useful negative acting compositions comprise a resin binder such as a phenolic resin, a crosslinker component and a photoactive component. Such compositions and the use thereof are disclosed in European Patent Nos. EP0164248B1 and EP0232972B1, and in U.S. Pat. No. 5,128,232. Typical phenolic resins for use as the resin binder component include novolaks and poly(vinylphenol)s such as those discussed above. Typical crosslinkers include amine-based materials, including melamine, glycolurils, benzoguanamine-based materials and urea-based materials. Melamine-formaldehyde resins are generally most typical. Such crosslinkers are commercially available, for example: the melamine resins sold by Cytec Industries under the trade names Cymel 300, 301 and 303; glycoluril resins sold by Cytec Industries under the trade names Cymel 1170, 1171, 1172; urea-based resins sold by Teknor Apex Company under the trade names Beetle 60, 65 and 80; and benzoguanamine resins sold by Cytec Industries under the trade names Cymel 1123 and 1125. For imaging at sub-200 nm wavelengths such as 193 nm, typical negative-acting photoresists are disclosed in International Application Pub. No. WO 03077029.

The photoresists useful in the invention are generally prepared following known procedures. For example, a resist can be prepared as a coating composition by dissolving the components of the photoresist in a suitable solvent, for example, a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between about 2 and 25 wt % based on the total weight of the photoresist composition. Blends of such solvents also are suitable.

The methods of the invention can be used with a variety of imaging wavelengths, for example, radiation having a wavelength of sub-400 nm, sub-300 or sub-200 nm exposure wavelength, with I-line (365 nm), 248 nm and 193 nm being typical exposure wavelengths, as well as EUV and 157 nm. In an exemplary aspect, the photoresists are suitable for use with and imaged at a sub-200 nm wavelength such as 193 nm. At such wavelengths, the use of immersion lithography is typical although dry processing can be used. In immersion lithography, a fluid (i.e., an immersion fluid) having a refractive index of between about 1 and about 2 is maintained between an exposure tool and the photoresist layer during exposure. A topcoat layer is typically disposed over the photoresist layer to prevent direct contact between the immersion fluid and photoresist layer to avoid leaching of components of the photoresist into the immersion fluid.

The photosensitive composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photosensitive layer 106 is from about 500 to 1500 Å. The photosensitive layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photosensitive layer and thickness. Typical softbakes are conducted at a temperature of from about 90 to 150° C., and a time of from about 30 to 90 seconds.

If the photosensitive layer 106 is to be exposed with an immersion lithography tool, for example a 193 nm immersion scanner, a topcoat layer (not shown) can be disposed over the photosensitive layer 106. Use of such a topcoat layer can act as a barrier between the immersion fluid and underlying photosensitive layer. In this way, leaching of components of the photosensitive composition into the immersion fluid, possibly resulting in contamination of the optical lens and change in the effective refractive index and transmission properties of the immersion fluid, can be minimized or avoided. Suitable topcoat compositions are commercially available, for example, OPTICOAT™ topcoat materials such as OC™ 2000 (Rohm and Haas Electronic Materials) and otherwise known in the art, for example, those described in U.S. Patent Application Pub. No. 2006/0246373A1 and in U.S. Provisional Application Nos. 61/204,007, filed Dec. 31, 2008. Such compositions can be applied over the photosensitive layer by any suitable method such as described above with reference to the photosensitive compositions, with spin coating being typical. The topcoat layer thickness is typically $\mu/4$ n (or an odd multiple thereof), wherein $\lambda$ is the wavelength of the exposure radiation and n is the refractive index of the topcoat layer. If a topcoat layer is present, the photosensitive layer 106 can be softbaked after the topcoat layer composition has been applied rather than prior to topcoat application. In this way, the solvent from both layers can be removed in a single thermal treatment step.

The photosensitive layer 106 is next exposed to activating radiation 108 through a first photomask 110 to create a difference in solubility between exposed and unexposed regions. For a positive-acting material, as illustrated, the photomask has optically transparent and optically opaque regions, the optically transparent regions corresponding to regions of the photosensitive layer to be removed in a subsequent development step. For negative-acting materials, the optically opaque regions would correspond with portions of the resist layer to be developed away. The exposure energy is typically from about 1 to 100 mJ/cm$^2$, dependent upon the exposure tool and the components of the photosensitive composition. References herein to exposing a photosensitive composition to radiation that is activating for the composition indicates that the radiation is capable of forming a latent image in the photosensitive composition such as by causing a reaction of the photoactive component, for example, by producing photoacid from a photoacid generator compound. The photosensitive compositions are typically photoactivated by a short exposure wavelength, particularly a sub-400 nm, sub-300 nm or sub-200 nm exposure wavelength, with I-line (365 nm), 248 nm and 193 nm being typical exposure wavelengths, as well as 157 nm and 13.4 nm.

Following exposure of the photosensitive layer 106, a post-exposure bake (PEB) of the photosensitive layer is performed at a temperature above the softening point of the layer. The PEB can be conducted, for example, on a hotplate or in an oven. Conditions for the PEB will depend, for example, on the particular material of the photosensitive layer and thickness. The PEB is typically conducted at a temperature of from about 80 to 150° C., and a time of from about 30 to 90 seconds.

The exposed photosensitive layer 106 is next developed to form a first resist pattern 106' as shown in FIG. 1B. While the developer material will depend on the particular material of the photosensitive layer 106, suitable developers and development techniques are known in the art. Typical developers include, for example, aqueous base developers such as quaternary ammonium hydroxide solutions, for example, tetra-alkyl ammonium hydroxide solutions such as 0.26 N tetramethylammonium hydroxide.

Following development, the resist pattern 106' is heat-treated in a first hardbake process to dry the pattern and form a hardened resist pattern 106", as shown in FIG. 1C. This heat-treatment is believed to facilitate adsorption of the subsequently applied surface treatment chemistry to the resist pattern. The hardbake is typically conducted with a hot plate or oven, and is typically conducted at a temperature of about 150° C. or higher, for example, from about 170 to 180° C., and a time of from about 30 to 120 seconds.

With reference to FIG. 1D, the hardbaked resist pattern 106" is treated with a material effective to make alkaline a surface of the resist pattern. The alkaline surface interferes with reaction during exposure of a subsequently applied thermally sensitive layer over the resist pattern. For example, in the case of a positive-acting thermally sensitive layer, acid-catalyzed deprotection reaction is prevented in regions in the immediate vicinity of the underlying alkaline-treated resist pattern. As a consequence, portions of the thermally sensitive layer would remain in those regions after development. In the case of an acid-catalyzed negative-acting thermally sensitive layer for the overcoated layer, polymerization would be inhibited in that layer in the immediate vicinity of the alkaline-treated resist pattern.

While not limited thereto, particularly suitable materials comprise an alkaline material and a surfactant which is different from the alkaline material. It is believed that the surfactant promotes formation of a substantially uniform coating layer of the second resist over the alkaline material treated resist pattern.

The alkaline material can take various forms, and may be in the form of a solution formed by dissolving a solid compound in a suitable solvent. Suitable alkaline materials for the resist pattern treatment include, for example, aqueous base developers such as quaternary ammonium hydroxide solutions, for example, tetra-alkyl ammonium hydroxide solutions such as 0.26 Normality (N) (2.38 wt %) tetramethylammonium hydroxide (TMAH). Solvent materials used for the alkaline material and otherwise in the compositions should not dissolve or minimize dissolution of the underlying photoresist The alkaline material (absent any solvent, e.g., water, alcohol or the like) is typically present in the compositions in an amount of from about 1 to 10 wt %, based on the total composition.

Suitable surfactants for the resist pattern treatment compositions include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants for use in the aqueous solution include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J.

Nonionic surfactants that are acetylenic diol derivatives also can be suitable, including such surfactants of the following formulae:

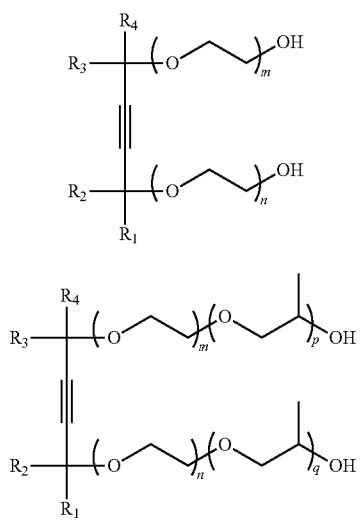

wherein $R_1$ and $R_4$ are a straight or a branched alkyl chain having from 3 to 10 carbon atoms; $R_2$ and $R_3$ are either H or an alkyl chain suitably having from 1 to 5 carbon atoms; and m, n, p, and q are numbers that range from 0 to 20. Such surfactants are commercially available from Air Products and Chemicals, Inc. of Allentown, Pa. trade names of SUR-FYNOL® and DYNOL®.

Additional suitable surfactants for use in coating compositions of the invention include other polymeric compounds such as the tri-block EO-PO-EO co-polymers PLURONIC® 25R2, L121, L123, L31, L81, L101 and P123 (BASF, Inc.).

Particularly suitable surfactants include amines, typically primary and secondary amines, i.e., an amine including one or more primary amine groups and one or more secondary amine groups, respectively, and combinations thereof. Tertiary amine groups can be present in addition to the primary and/or secondary amine groups. Typically, the amine is a multifunctional amine. The amine can be a polyamine, such as a diamine, triamine or tetra-amine. Suitable primary amines include compounds of the following formula (I):

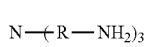

wherein R is chosen from optionally substituted alkyl such as optionally substituted C1 to C6 alkyl, such as methyl, ethyl or propyl, with ethyl being typical. Other suitable primary amines include poly(allyl amines) represented by the following formula (II):

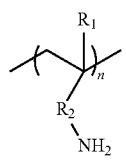

wherein: $R_1$ is chosen from hydrogen and optionally substituted alkyl such as C1 to C3 alkyl; $R_2$ is chosen from optionally substituted alkylene such as C1 to C6 alkylene, typically methylene or ethylene; and n is an integer greater than or equal to 3. In an exemplary primary amine of the formula (N-II), $R_1$ is hydrogen and $R_2$ is methylene. Other suitable amines include those represented by the following general formulae (III), (IV) and (V):

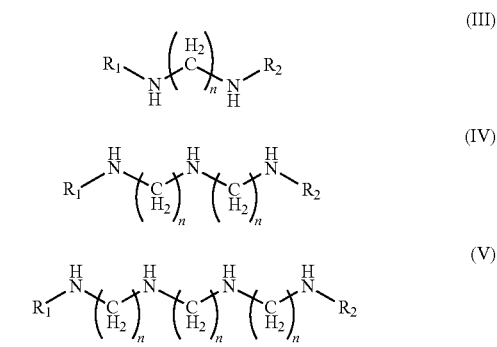

wherein $R_1$ and $R_2$ are each independently a hydrogen atom or an alkyl group with 1 to 10 carbon atoms, and n is an integer from 1 to 10. Other suitable amines include the following:

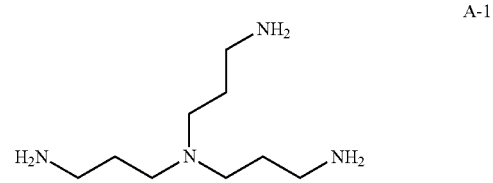

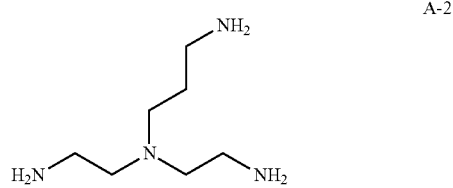

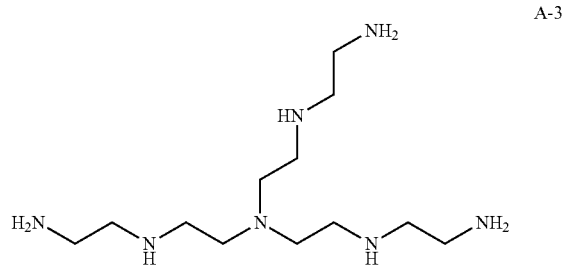

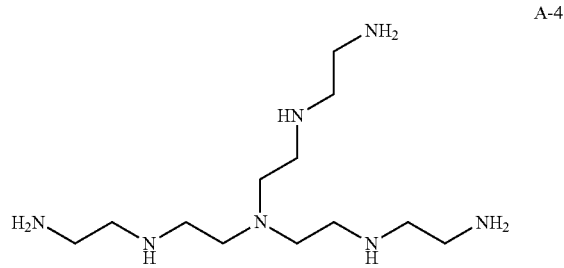

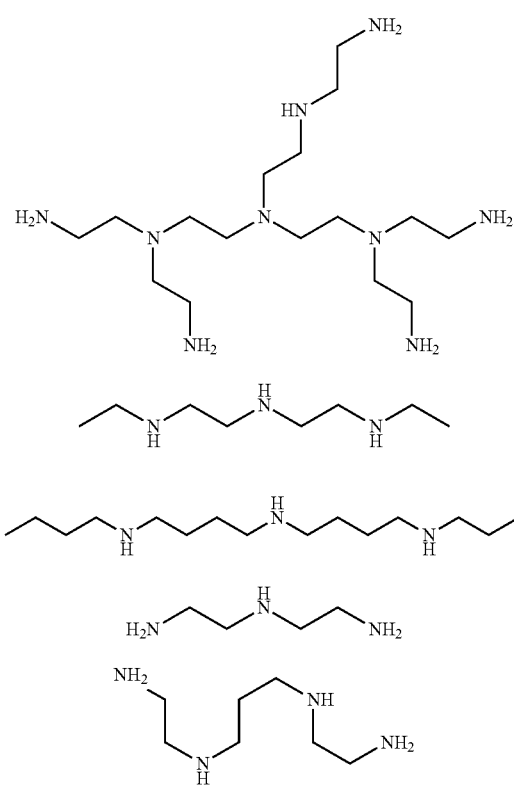

Of these, tris(2-aminoethyl)amine (TAEA) is particularly preferred.

The surfactant is typically present in the compositions in a relatively small amount, for example, from 0.01 to 5 wt %, for example, from 0.01 to 1 wt %, based on the weight of total solids in the composition (total solids being all compositions components except solvent carrier).

The resist pattern treatment compositions can comprise one or more optional components in addition to the alkaline material and surfactant components. For example, the compositions can include one or more solvent in addition to any solvent used for the alkaline material and surfactant. As described above, solvent materials used for the alkaline material and otherwise in the compositions should not dissolve or minimize dissolution of the underlying photoresist. Suitable solvents will therefore depend on the particular underlying resist material and may include, for example, water and alcohols such as n-butanol. The optional components also include one or more base generator compound, such as a thermal base generator compound and/or a photobase generator compound.

The photoresist pattern treatment compositions can be prepared by admixture in any order of the alkaline material and surfactant components, and any additional components such as solvent and base generator compounds. One or more of the components can be added as a solid or as a pre-mixed solution using a suitable solvent.

Preferably, the alkaline treatment includes treatment with a quaternary ammonium hydroxide and an amine. The quaternary ammonium hydroxide material and amine can be simultaneously applied to the substrate, for example, either from a premixed composition or by applying the materials simultaneously but separate from one another in which case the composition is formed in situ. Preferably, the quaternary ammonium hydroxide material and amine are sequentially applied in that order. The quaternary ammonium hydroxide and amine materials can be applied as a liquid, gas or vapor, and can be applied, for example, by spin-coating, dipping, vapor-coating, chemical vapor deposition (CVD) or other conventional coating technique. Of these, spin-coating of liquid materials is typical. Typically, the quaternary ammonium hydroxide and amine materials can be applied as aqueous solution(s). Where the quaternary ammonium hydroxide and amine are applied simultaneously, the surface treated substrate can be rinsed, for example, with deionized water.

Where the quaternary ammonium hydroxide and amine materials are sequentially applied, the amine can be applied as an aqueous solution, functioning also as a water rinse. The surface treated substrate can optionally be rinsed, for example, with deionized water to remove excess composition.

When using a developer such as TMAH in the alkaline treatment, critical dimension (CD) of the resist pattern 106" becomes slightly reduced as a result of the surface treatment as compared with the original CD of resist pattern 106'. This CD loss is believed to be attributed to further development of the first resist pattern during the surface treatment. The surface treatment forms a modified first resist pattern surface 112 which is alkaline and which has a line width roughness less than that of the pre-treated surface.

A thermally sensitive composition is next coated over the resist pattern 106" and BARC layer 104 to form a thermally sensitive layer 114, as shown in FIG. 1E. The thermally sensitive layer 114 can be applied so as to cover the resist pattern 106" entirely or to a height less than or equal to the thickness of the resist pattern 106", depending on the particular application. The thermally-sensitive compositions can be the same as described above with respect to the photosensitive compositions except a thermally-sensitive component such as a thermal acid generator (TAG) is used in place of the photoactive component. Suitable TAGs are known in the art. For example, in the case of a material based on a deprotection reaction, suitable TAGs include any that on heating generate an acid which can cleave the bond of the acid labile group of the thermally-sensitive layer 114, particularly a strong acid such as a sulfonic acid. Typically, the thermal acid generator is activated at above 90° C., for example, above 120° C. or above 150° C. The thermally-sensitive layer is heated for a sufficient length of time for the thermal acid generator to react with the resin component of the composition. Examples of thermal acid generators include nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Typically, the TAG will have a very low volatility at temperatures between 170 and 220° C. Examples of TAGs include those sold by King Industries, Norwalk, Conn. USA under NACURE™, CDX™ and K-PURE™ names, for example, NACURE 5225, CDX-2168E, K-PURE™ 2678 and K-PURE™ 2700. The thermally-sensitive component is typically present in the composition in an amount of from about 1 to 20 wt % based on the total solids of the composition.

As with the photosensitive composition being a positive-acting or negative-acting material, the tone of the thermally sensitive composition similarly can be positive- or negative-acting. Generally, however, selection for this composition will depend on the particular application and geometries involved. In the illustrated method, both the photosensitive and thermally sensitive compositions are positive acting.

The thermally sensitive layer 114 can next optionally be soft-baked, and then heat-treated with heater 109 as shown in FIG. 1F to a temperature effective to cause the TAG to generate an acid and is developed. The alkaline-modified surface region 112 of the first resist pattern 106" prevents thermal reaction in the second resist layer 114 in the vicinity of the surface region. As a result, a layer 114' of the unreacted second thermally sensitive composition remains over the resist pattern 106". The resulting developed image has an improved (i.e., reduced) surface roughness as compared with that of the resist pattern following development of the first photoresist layer.

Following development of the thermally sensitive layer, the BARC layer 104 is selectively etched using the modified resist pattern 106" as an etch mask to expose the underlying hardmask layer 103. The hardmask layer is next selectively etched, again using the modified resist pattern 106" as an etch mask, resulting in patterned BARC and hardmask layers 104', 103', as shown in FIG. 1H. Suitable etching techniques and chemistries for etching the BARC layer and hardmask layer are known in the art and will depend, for example, on the particular materials of these layers. Dry-etching processes such as reactive ion etching are typical. The modified resist pattern 106" and patterned BARC layer 104' are next removed from the substrate using known techniques, for example, an oxygen plasma ashing.

Using the hardmask pattern 103' as an etch mask, the one or more layers 102 are selectively etched. Suitable etching techniques and chemistries for etching the underlying layers 102 are known in the art, with dry-etching processes such as reactive ion etching being typical. The patterned hardmask layer 103' can next be removed from the substrate surface using known techniques, for example, a dry-etching process such as reactive ion etching. The resulting structure is a pattern of etched features 102' as illustrated in FIG. 1I.

In an alternative exemplary method, it may be desirable to pattern the layer 102 directly using the modified photoresist pattern 106" without the use of a hardmask layer 103. Whether direct patterning with the resist pattern can be employed will depend on factors such as the materials involved, resist selectivity, resist pattern thickness and pattern dimensions.

The invention can be applied to a variety of situations in the manufacture of electronic devices. For example, the invention finds particular use as the basis for double patterning (or pitch-splitting) such as self-aligned spacer double patterning, shrink processes such as those useful in forming contact holes and trenches, and improvement in resist pattern line width roughness. Resist patterns can be controllably trimmed or widened as desired. Except as otherwise indicated below, the description above with respect to the general process and FIG. 1 is applicable to each of the processes described below.

Self-Aligned Spacer Double Patterning

Figure 2:
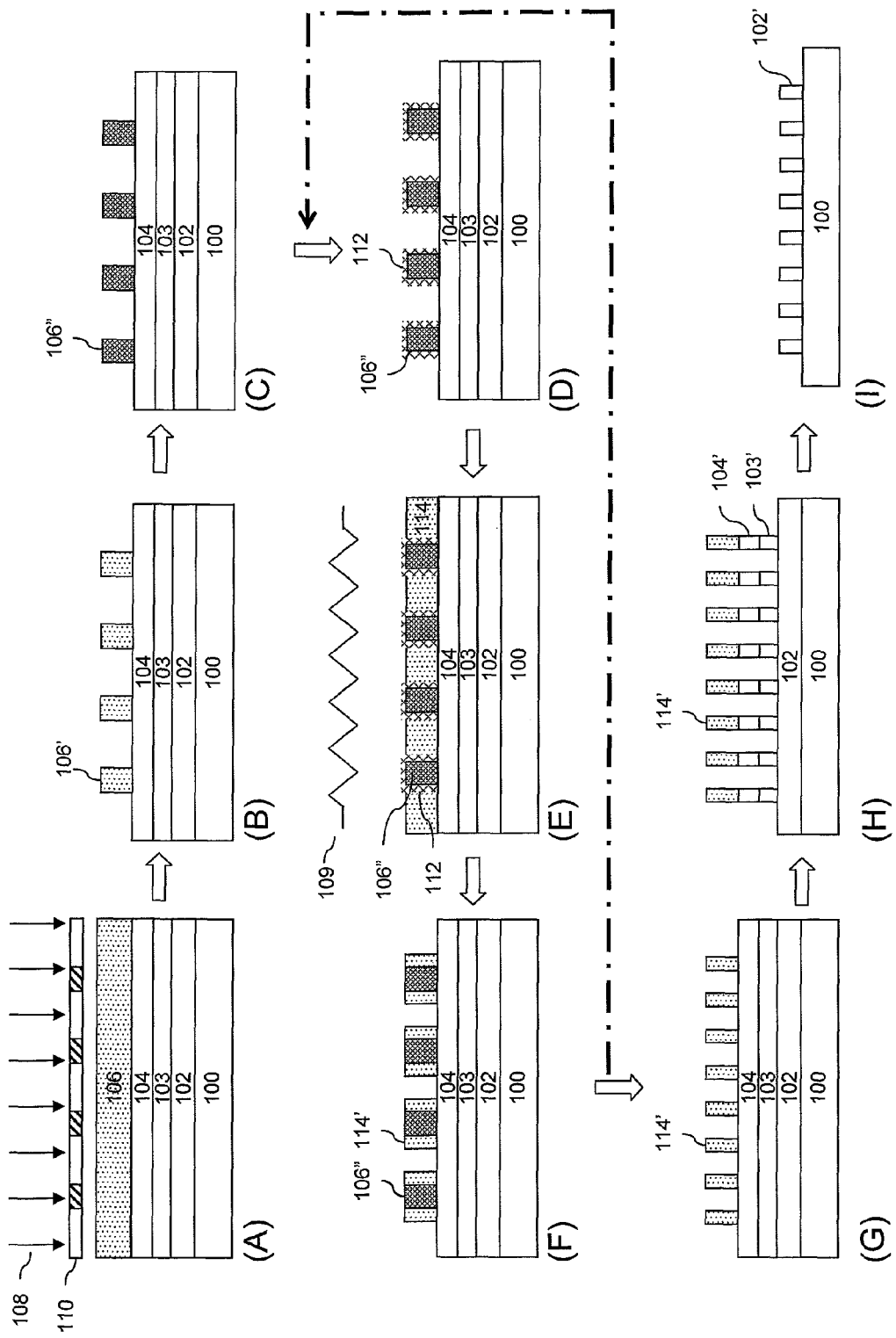
Figure 3:
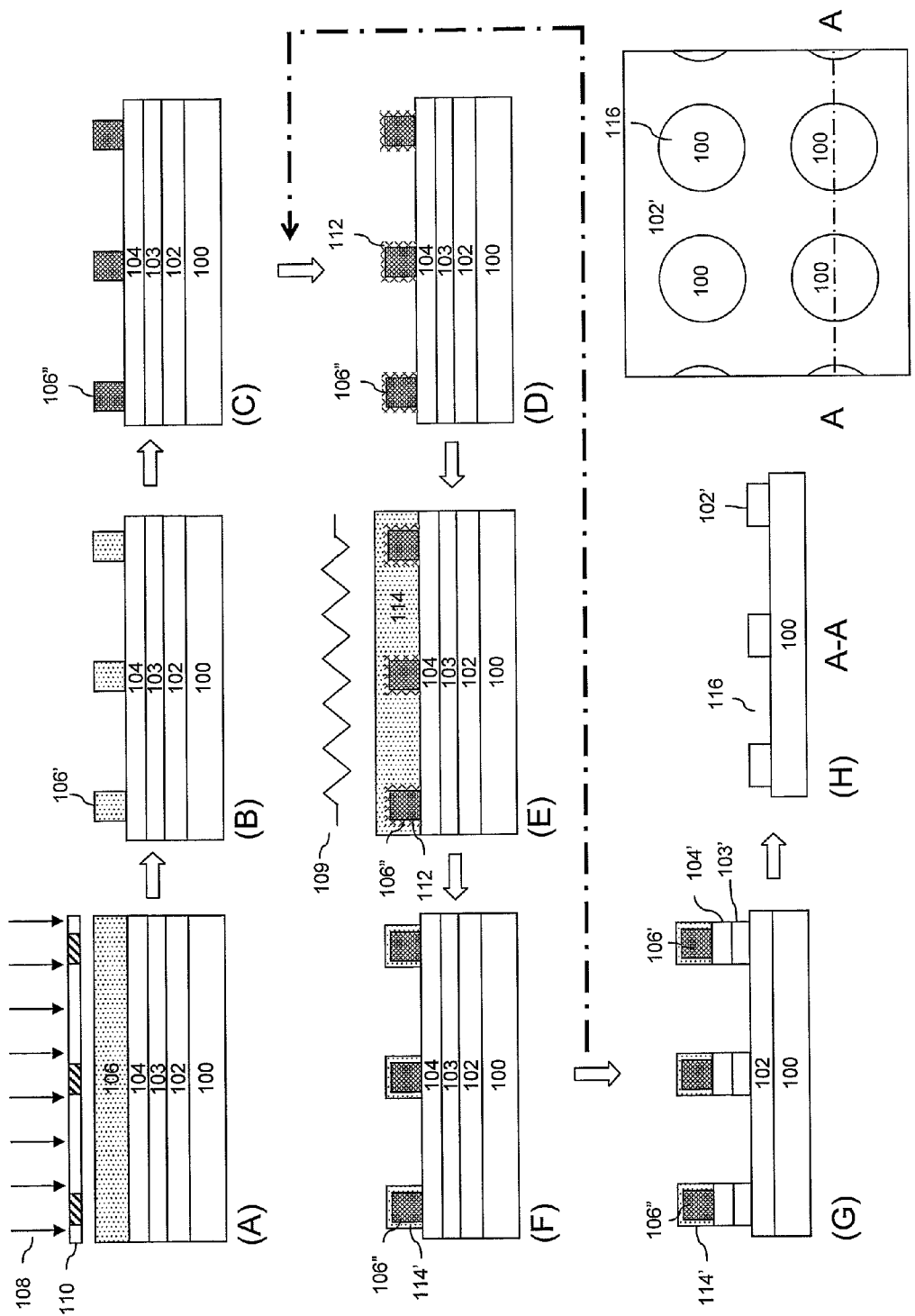

An exemplary double patterning process in accordance with the invention will now be described with reference to FIG. 2, which illustrates a process flow for self-aligned spacer double-patterning. As shown in FIG. 2A-E, a hardened resist pattern 106" having a surface 112 modified by alkaline treatment and coated with a thermally sensitive layer 114 is formed in the same manner described above with reference to FIG. 1. The photosensitive layer 106 can be positive- or negative-acting, while the thermally sensitive layer 114 is positive-acting. The thermally sensitive layer 114 is typically coated to a thickness less than that of the surface-treated resist pattern 106" to facilitate removal of the resist pattern in a subsequent step as described below. Also for purposes of removing the first resist pattern 106", the etchant to be used should have good selectivity to the photosensitive pattern relative to the thermally sensitive material. As such, the photosensitive and thermally sensitive resin materials should be different. It may, for example, be desired to use a silicon-based polymer such as a silsesquioxane-type polymer in one of the materials while using a different chemistry such as an acrylate-, novolak- or phenolic-type polymer for the other of the photosensitive and thermally sensitive compositions.

With reference to FIG. 2(E), the thermally sensitive layer 114 is thermally treated by a heater 109. The heated layer is developed, leaving behind a spacers 114' on sidewalls of each line of the resist pattern 106", as illustrated in FIG. 2F. At this point, if desired to adjust the width of the spacers, for example to increase the width, a series of steps in the process can be repeated one or more times beginning with the first hardbake through development of an additional thermally sensitive layer, as indicated by the dashed arrow.

The photoresist pattern is next removed, leaving behind the spacers 114', as shown in FIG. 2G. The spacers 114' are then used as an etching mask to pattern one or more underlying layers directly or to first pattern an underlying hardmask layer which is then used to pattern the underlying layers. The BARC layer 104 is next selectively etched using the spacers 114' as an etch mask, exposing the underlying hardmask layer 103. The hardmask layer is next selectively etched, again using the spacers 114' as an etch mask, resulting in patterned BARC and hardmask layers 104', 103', as shown in FIG. 2H. The spacers 114' and patterned BARC layer 104' are next removed from the substrate using known techniques.

Using the hardmask pattern 103' as an etch mask, the one or more layers 102 are selectively etched. The patterned hardmask layer 103' can next be removed from the substrate surface. The resulting double patterned structure is a pattern of etched features 102' as illustrated in FIG. 2I. In an alternative exemplary method, it may be desirable to pattern the layer 102 directly using the spacers 114' without the use of a hardmask layer 103. Whether direct patterning with the spacers can be employed will depend on factors such as the materials involved, resist selectivity, resist pattern thickness and pattern dimensions.

Positive Resist Shrink Process

In accordance with a further aspect, the invention can be applied to shrink processes. A first exemplary shrink process will be described with reference to the process flow shown in FIG. 3. While the exemplified process is for a contact hole shrink process, it should be clear that the process can be applied to other shrink applications in electronic device fabrication. As used herein, the term "contact hole" is inclusive of via holes. Typically, the contact hole is formed in one or more layers of a dielectric material, such as one or more oxide layers, for example, doped or undoped silicon oxide layers, with the underlying feature forming the bottom of the contact hole being conductive or semiconductive, such as a metal or semiconductor layer or region. The contact hole may, for example, join together two metal layers or a metal layer with an active region of a semiconductor substrate.

As shown in FIG. 3A-F, a hardened resist pattern 106" having a surface 112 modified by alkaline treatment and coated with a second photosensitive layer 114 is formed in the same manner described above with reference to FIG. 1. The mask 110 used in the exposure process illustrated in FIG. 3A includes contact hole patterns taking the form of circular patterns (as illustrated) or cross-line patterns. The photosensitive composition can be a positive-acting or negative-acting material. The thermally sensitive composition is typically positive-acting as illustrated and is heated as shown in FIG. 3E. Following development of the thermally sensitive layer as shown in FIG. 3F, if desired to adjust the pattern width, for example to increase the patterned thickness of the thermally sensitive layer 114' over the resist pattern 106", corresponding to a decreased contact hole diameter, a series of steps in the process can be repeated one or more times beginning with the first hardbake through development of an additional layer of the thermally sensitive composition, as indicated by the dashed arrow.

With reference to FIG. 3G-H, following development of the thermally sensitive layer, patterning with the resist pattern 106" as modified with the thermally sensitive coating is carried out as described above with reference to FIG. 1. The resulting structure is a pattern of etched contact hole features 116, shown in cross-sectional and top-down views in FIG. 3H.

Negative Resist Shrink Process

Figure 4:
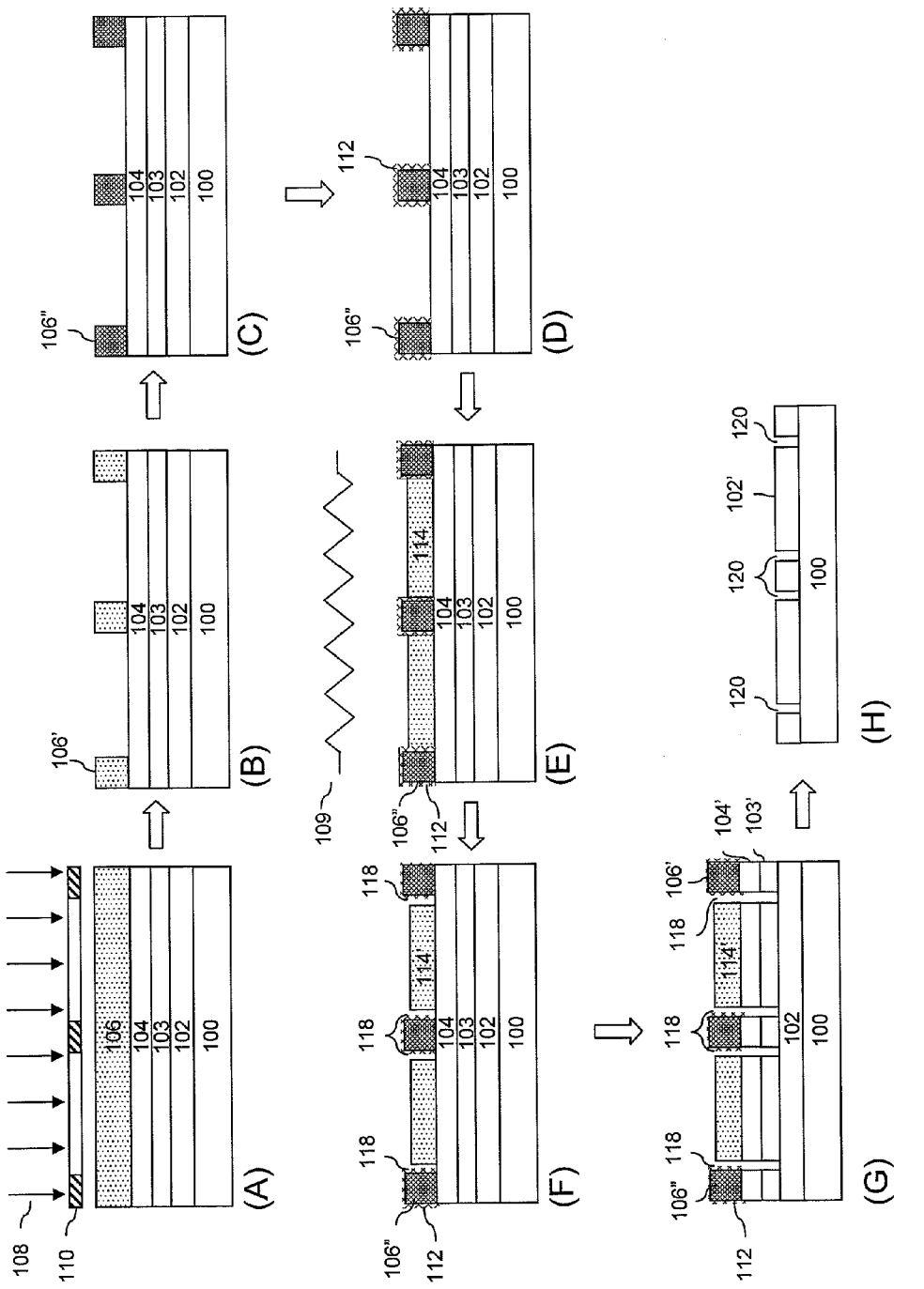

A second exemplary shrink process will be described with reference to the process flow shown in FIG. 4. This shrink process can be applied, for example, to the formation of trenches or other device features in electronic device fabrication. As shown in FIG. 4A-D, a hardened resist pattern 106" having a surface 112 modified by alkaline treatment is formed in the same manner described above with reference to FIG. 1.

A layer of a thermally sensitive composition 114 is coated over the substrate to a thickness less than or equal to the thickness of the resist pattern 106", as shown in FIG. 4E. While the photosensitive composition can be a positive-acting or negative-acting material, the thermally sensitive composition is negative-acting. As illustrated, the thermally sensitive layer 114 is heated causing polymerization of the layer in all areas except in the immediate vicinity of the alkaline-treated resist pattern 106". In this way, development of the heated layer removes only that material in the immediate vicinity of the resist pattern 106", leaving narrow spaces 118 between the first and second patterns 106", 114', as shown in FIG. 4F.

With reference to FIG. 4G-H, following development of the thermally sensitive layer, patterning with the patterns 106", 114' is carried out as described above with reference to FIG. 1. The resulting structure is a pattern of etched features 120 such as trenches.

The following non-limiting examples are illustrative of the invention.

EXAMPLES

Example 1

L1 Resist Polymer
(Poly(IAM/α-GBLMA/ODOTMA/HAMA))
Synthesis 10.51 g of 2-methyl-acrylic acid 1-isopropyl-adamantanyl ester (IAM), 6.82 g of 2-methyl-acrylic acid 2-oxo-tetrahydro-furan-3yl ester (α-GBLMA), 6.36 g of 2-methyl-acrylic acid 3-oxo-4,10-dioxa-tricyclo[5.2.1.0$^{2,6}$]dec-8-yl ester (ODOTMA) and 6.31 g of 2-methyl-acrylic acid 3-hydroxy-adamantanyl ester (HAMA) are dissolved in 27 g of tetrahydrofuran (THF). The mixture is degassed by bubbling with nitrogen for 20 minutes. A 500 ml flask equipped with a condenser, nitrogen inlet and mechanical stirrer is charged with 11 g of THF, and the solution is brought to a temperature of 67° C. 5.23 g of dimethyl-2,2-azodiisobutyrate (17 mol % based on total monomers) is dissolved in 5 g of THF and is charged into the flask. The monomer solution is fed into a reactor at a rate of 16.0 milliliters per hour (mL/h) for 3 hours 30 minutes. The polymerization mixture is stirred for an additional 30 minutes at 67° C. 5 g of THF is next added to the reactor and the polymerization mixture is cooled to room temperature. Precipitation was carried out in 1.0 L of isopropyl alcohol. After filtration, the polymer was dried, re-dissolved in 50 g of THF, re-precipitated into 1.1 L of isopropyl alcohol, filtered and dried in a vacuum oven at 45° C. for 48 hours, resulting in 25.4 g of the poly(IAM/α-GBLMA/ODOTMA/HAMA) polymer (Mw=7,934 and Mw/Mn=~1.46) shown below:

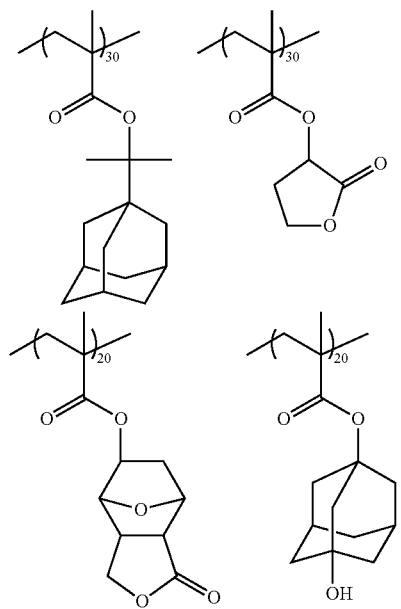

L1 Photoresist Formulation 3.169 g of the above polymer is dissolved in 96.38 g of a solvent mixture of 70 wt % propylene glycol monomethyl ether acetate (PGMEA) and 30 wt % cyclohexanone. To this mixture is added 0.405 g of triphenylsulfonium (adamantan-1yl methoxycarbonyl)-difluoro-methanesulfonate, 0.041 g of 1-(tert-butoxycarbonyl)-4-hydroxypiperidine and 0.005 g of POLYFOX® PF-656 surfactant (Omnova Solutions Inc.). The resulting mixture is rolled on a roller for six hours and then filtered through a Teflon filter having a 0.2 micron pore size to form a positive-acting photoresist composition.

Thermally Active Resist Formulation 3.169 g of a polymer as described above is dissolved in 96.38 g of a solvent mixture of 70 wt % propylene glycol monomethyl ether acetate (PGMEA) and 30 wt % cyclohexanone. To this mixture is added 0.5 g of K-PURE™ 2700 TAG (King Industries, Norwalk, Conn. USA) and 0.005 g of POLYFOX® PF-656 surfactant (Omnova Solutions Inc.). The resulting mixture is rolled on a roller for six hours and then filtered through a Teflon filter having a 0.2 micron pore size, to faun a positive-acting thermally sensitive resist composition.

Surface Treatment Solution Formulation

A surface treatment solution is prepared by mixing 5 g of 1 wt % tris(2-aminoethyl)amine (TAEA) (Sigma-Aldrich) solution in deionized water, 1 g of 10 wt % of a surfactant solution (TERGITOL TMN-6, The Dow Chemical Company, Midland, Mich., USA) and 194 g of deionized water. This solution is filtered through a nylon filter having a 0.1 micron pore size.

First Lithography (L1) Patterning of Lines and Spaces

A 300 mm silicon wafer is spin-coated with AR™40A antireflectant (Rohm and Haas Electronic Materials) to form a first bottom antireflective coating (BARC) on a TEL CLEAN TRACK™ LITHIUS™ i+coater/developer. The wafer is baked for 60 seconds at 215° C., yielding a first BARC film thickness of 75 nm. A second BARC layer is next coated over the first BARC using AR™124 antireflectant (Rohm and Haas Electronic Materials), and is baked at 205° C. for 60 seconds to generate a 23 nm top BARC layer.

The L1 photoresist composition is coated on top of the dual BARCs and is soft-baked at 110° C. for 60 seconds to provide a resist film thickness of 950 Å. The L1 resist layer is coated with a topcoat layer (OC™2000 topcoat material, Rohm and Haas Electronic Materials) and is exposed at various doses from 15 to 75 mJ/cm$^2$ through a reticle having various critical dimensions using an ASML TWINSCAN™ XT:1900i immersion scanner with a numerical aperture of 1.35 and dipole-35Y illumination (0.96 outer sigma/0.76 inner sigma) with X-polarization. The wafer is then post-exposure baked (PEB) at 100° C. for 60 seconds and is developed for 12 seconds using Microposit™ MF CD-26 developer (Rohm and Haas Electronic Materials) to render first lithography (L1) patterns.

Curing and Surface Treatment

The wafer is hardbaked at 180° C. for 60 seconds. The wafer is next exposed to surface treatment chemistry in a sequential process by which the wafer is first rinsed with 2.38 wt % TMAH in water solution for 12 seconds using a TEL GP nozzle, and is then rinsed with the surface treatment solution formulation described above.

Second Resist Process

The L2 thermally active resist formulation is coated over the surface-treated L1 patterns on the coater/developer at a spin speed that would provide a film thickness of 650 Å on a bare silicon wafer. The wafer is soft-baked at 120° C. for 60 seconds, and is then hard baked at 180° C. for 60 seconds. The wafer is then developed for 12 seconds using Microposit™ MF CD-26 developer (Rohm and Haas Electronic Materials). Spacers would be expected to be formed on sidewalls of the resist patterns.

Examples 2-43

The procedures of Example 1 are repeated except the surface treatment solutions are prepared by adding together the components of Table 1 and filtering through a nylon filter having a 0.1 micron pore size. Spacers would be expected to be formed on sidewalls of the resist patterns.

TABLE 1

| Ex. | Amines[1] | Surfactant[2] | DI Water (g) |
|---|---|---|---|
| 1 | A-1 (5 g) | S-1 (1 g) | 194 |
| 2 | A-1 (2.5 g) | — | 97.5 |
| 3 | A-1 (1 g) | — | 99 |
| 4 | A-1 (0.1 g) | — | 99.9 |
| 5 | A-1 (2.5 g) | S-2 (1 g) | 96.5 |
| 6 | A-1 (2.5 g) | S-1 (1 g) | 96.5 |
| 7 | A-1 (2.5 g) | S-1 (0.75 g) | 96.75 |
| 8 | A-1 (2.5 g) | S-1 (0.5 g) | 97 |
| 9 | A-1 (2.5 g) | S-3 (10 g) | 87.5 |
| 10 | A-1 (2.5 g) | S-4 (20 g) | 77.5 |
| 11 | A-1 (2.5 g) | S-5 (0.05 g) | 97.45 |
| 12 | A-1 (1 g) | S-1 (0.1 g) | 98.9 |
| 13 | A-1 (1 g) | S-1 (0.3 g) | 98.7 |
| 14 | A-1 (1 g) | S-1 (0.5 g) | 98.5 |
| 15 | A-1 (2.5 g) | S-1 (0.1 g) | 97.4 |
| 16 | A-1 (2.5 g) | S-1 (0.3 g) | 97.2 |
| 17 | A-1 (5 g) | S-1 (0.1 g) | 94.9 |
| 18 | A-1 (5 g) | S-1 (0.3 g) | 94.7 |
| 19 | A-1 (5 g) | S-1 (0.5 g) | 94.5 |
| 20 | A-2 (1 g) | — | 99 |
| 21 | A-2 (1 g) | S-1 (1 g) | 98 |
| 22 | A-2 (2.5 g) | S-1 (1 g) | 96.5 |
| 23 | A-3 (1 g) | — | 99 |
| 24 | A-3 (1 g) | S-1 (1 g) | 98 |
| 25 | A-3 (2.5 g) | S-1 (1 g) | 96.5 |
| 26 | A-4 (1 g) | — | 99 |
| 27 | A-4 (1 g) | S-1 (1 g) | 98 |
| 28 | A-4 (2.5 g) | S-1 (1 g) | 96.5 |
| 29 | A-5 (1 g) | — | 99 |
| 30 | A-5 (1 g) | S-1 (1 g) | 98 |
| 31 | A-5 (2.5 g) | S-1 (1 g) | 96.5 |
| 32 | A-6 (1 g) | — | 99 |
| 33 | A-6 (1 g) | S-1 (1 g) | 98 |
| 34 | A-6 (2.5 g) | S-1 (1 g) | 96.5 |
| 35 | A-7 (1 g) | — | 99 |
| 36 | A-7 (1 g) | S-1 (1 g) | 98 |
| 37 | A-7 (2.5 g) | S-1 (1 g) | 96.5 |
| 38 | A-8 (1 g) | — | 99 |
| 39 | A-8 (1 g) | S-1 (1 g) | 98 |
| 40 | A-8 (2.5 g) | S-1 (1 g) | 96.5 |
| 41 | A-9 (1 g) | — | 99 |
| 42 | A-9 (1 g) | S-1 (1 g) | 98 |
| 43 | A-9 (2.5 g) | — | 96.5 |

[1]Amines are 1 wt % solutions in water and have the structures as defined above;
[2]S-1 = Tergitol ™ TMN-6, 10 wt % in water (The Dow Chemical Company, Midland, MI, USA);
S-2 = Triton ™ X-100, 10 wt % in water (The Dow Chemical Company);
S-3 = Tetronics ™ 304, 10 wt % in water (BASF Corporation, Florham Park, NJ USA);
S-4 = Tetronics ™ 1307 (BASF Corporation, Florham Park, NJ USA);
S-5 = Surfynol ™ 2502 (Air Products and Chemicals, Inc., Allentown, PA, USA).

Example 44

The procedures of Example 1 are repeated except the L2 photoresist is prepared by dissolving 3.169 g of the L1 resist polymer in 96.38 g of a solvent mixture of 70 wt % propylene glycol monomethyl ether acetate (PGMEA) and 30 wt % cyclohexanone. To this mixture is added 0.5 g of K-PURE™ 2700 TAG (King Industries, Norwalk, Conn. USA) and 0.005 g of POLYFOX® PF-656 surfactant (Omnova Solutions Inc.). The resulting mixture is rolled on a roller for six hours and is then filtered through a Teflon filter having a 0.2 micron pore size, thereby forming a positive-acting thermally sensitive resist composition. Spacers would be expected to be formed on sidewalls of the resist patterns.

Examples 45

The procedures of Example 1 are repeated for L1 patterning, curing and surface treatment.

Negative-Acting Thermally Active Compositions 3.357 g of poly(4-hydroxy styrene) (VP3500 from Nisso, Japan) are dissolved in 95.843 g of propylene glycol monomethyl ether acetate (PGMEA). To this mixture is added 0.332 g of Powderlink-1174 (Cytec Industries, Woodland Park, N.J.), 0.302 g of K-PURE 2678 (King Industries, Norwalk, Conn.), 0.007 g of Coumarin-1 and 0.005 g of POLYFOX® PF-656 surfactant (Omnova Solutions Inc.). The resulting mixture is rolled on a roller for six hours and then filtered through a Teflon filter having a 0.2 micron pore size, thereby forming a negative-acting thermally active composition.

L2 Second Resist Process

The L2 negative-acting resist formulation is coated over the surface-treated L1 patterns on the coater/developer at a spin speed that would provide a film thickness of 650 Å on a bare silicon wafer. The wafer is soft-baked at 120° C. for 60 seconds, and is then hard baked at 180° C. for 60 seconds. The wafer is then developed for 12 seconds using Microposit™ MF CD-26 developer (Rohm and Haas Electronic Materials). Narrow gaps useful in the formation of structures such as trenches between L1 and L2 resist patterns would be expected to result.

What is claimed is:

1. A method of forming an electronic device, comprising:
   (a) providing a semiconductor substrate comprising one or more layers to be patterned;
   (b) applying a first layer of a photosensitive composition over the one or more layers to be patterned, wherein the first photosensitive composition comprises a first resin component and a photoactive component;
   (c) exposing the first layer to activating radiation through a patterned photomask;
   (d) developing the exposed first layer to form a resist pattern;
   (e) heat treating the resist pattern in a hardbake process;
   (f) treating the hardbaked resist pattern with a material effective to make alkaline a surface of the resist pattern;
   (g) applying a second layer of a thermally sensitive composition in contact with the alkaline surface of the resist pattern, the second composition comprising a second resin component and a thermal acid generator;
   (h) heating the second layer of the thermally sensitive composition to a temperature effective for the thermal acid generator to generate an acid; and
   (i) developing the heated second layer.

2. The method of claim 1, further comprising removing the resist pattern after the steps of heating and developing the second layer.

3. The method of claim 1, wherein the heat treating the resist pattern is conducted at a temperature of about 150° C. or higher.

4. The method of claim 1, wherein treating the resist pattern with the material effective to make alkaline a surface of the resist pattern comprises treating the resist pattern with an alkaline material and a surfactant which is different from the alkaline material.

5. The method of claim 1, wherein treating the resist pattern with the material effective to make alkaline a surface of the resist pattern comprises treating the resist pattern with a primary or secondary amine.

6. The method of claim 5, wherein treating the resist pattern with the material effective to make alkaline a surface of the resist pattern comprises sequentially treating the resist pattern with a quaternary ammonium hydroxide solution followed by treating the resist pattern with the primary or secondary amine.

7. The method of claim 5, wherein the amine is a compound of the following formula (I):

(I)

wherein R is chosen from optionally substituted C1-C6 alkyl groups.

8. The method of claim 7, wherein R is a C2 alkyl group.

9. The method of claim 1, wherein the amine is chosen from compounds of the following formulae (III), (IV) and (V):

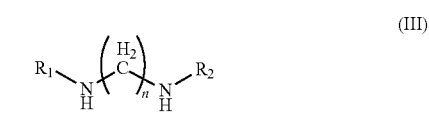
(III)

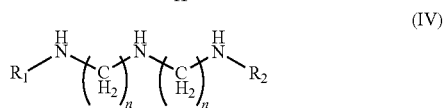
(IV)

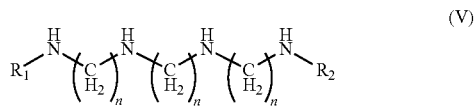
(V)

wherein $R_1$ and $R_2$ are each independently a hydrogen atom or a C1-C10 alkyl group; and n is an integer from 1 to 10.

10. A coated semiconductor substrate, comprising:
   a semiconductor substrate comprising one or more layers to be patterned;
   a resist pattern over the one or more layers to be patterned, the resist pattern having an alkaline surface; and
   a layer of a thermally sensitive composition in contact with the alkaline surface of the resist pattern, the second composition comprising a second resin component and a thermal acid generator.

11. The method of claim 1, wherein the hardbaked first resist pattern is treated with the material effective to make alkaline a surface of the first resist pattern in a spin coating process.

12. The method of claim 1, wherein the material effective to make alkaline a surface of the resist pattern comprises an aqueous base developer.

13. The method of claim 10, wherein the aqueous base developer is a quaternary ammonium hydroxide solution.

14. The method of claim 11, wherein the quaternary ammonium hydroxide solution is a tetramethylammonium hydroxide solution.

15. The method of claim 1, wherein the second layer is positive-acting.

16. The method of claim 1, wherein the second layer is negative-acting.

17. The method of claim 1, wherein steps (a) to (i) are conducted in sequence.

* * * * *